(12) United States Patent
Hayashi et al.

(10) Patent No.: US 7,671,453 B2
(45) Date of Patent: Mar. 2, 2010

(54) SEMICONDUCTOR DEVICE AND METHOD FOR PRODUCING THE SAME

(75) Inventors: Kenichi Hayashi, Tokyo (JP); Hisashi Kawafuji, Fukuoka (JP); Tatsuyuki Takeshita, Fukuoka (JP); Nobuhito Funakoshi, Fukuoka (JP); Hiroyuki Ozaki, Tokyo (JP); Kazuhiro Tada, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 10/946,470

(22) Filed: Sep. 22, 2004

(65) Prior Publication Data
US 2005/0067719 A1 Mar. 31, 2005

(30) Foreign Application Priority Data
Sep. 30, 2003 (JP) .............................. 2003-339730

(51) Int. Cl.
*H01L 23/495* (2006.01)
*H01L 23/28* (2006.01)
*H01L 23/29* (2006.01)

(52) U.S. Cl. ............... 257/668; 257/675; 257/676; 257/706; 257/713; 257/717; 257/725; 257/729; 257/735; 257/789; 257/793; 257/795; 257/796; 257/E23.039; 257/E23.049; 257/E23.053; 257/E23.056; 257/E23.066; 257/E23.077; 438/112; 438/122; 438/123; 438/124; 438/126; 438/127

(58) Field of Classification Search ...................... None
See application file for complete search history.

(56) References Cited

U.S. PATENT DOCUMENTS

| | | | |
|---|---|---|---|
| 6,225,701 B1 * | 5/2001 | Hori et al. ................... 257/783 |
| 6,791,839 B2 * | 9/2004 | Bhagwagar .................. 361/705 |
| 6,908,170 B2 * | 6/2005 | Merz ............................ 347/18 |
| 6,979,909 B2 | 12/2005 | Shinohara |
| 7,045,907 B2 | 5/2006 | Shinohara |
| 2002/0109211 A1 * | 8/2002 | Shinohara ................... 257/666 |
| 2003/0011054 A1 * | 1/2003 | Jeun et al. ................... 257/678 |

(Continued)

FOREIGN PATENT DOCUMENTS

JP          5-21492          1/1993

(Continued)

OTHER PUBLICATIONS

Korean Office Action; No. Sep. 5, 2006-017000617; Mar. 28, 2006.

(Continued)

*Primary Examiner*—Andy Huynh
*Assistant Examiner*—Hoang-Quan T Ho
(74) *Attorney, Agent, or Firm*—Buchanan Ingersoll & Rooney PC (57) ABSTRACT

A semiconductor device in which chips are resin-molded, including: frames having front and back surfaces and die pads; power chips mounted on the surfaces of the die pads; an insulation resin sheet having a first and a second surfaces which are opposed against each other, the resin sheet being disposed such that the back surfaces of the die pads contact the first surface of the resin sheet; and a mold resin applied on the first surface of the resin sheet so as to seal up the power chips. The thermal conductivity of the resin sheet is larger than that of the mold resin.

8 Claims, 6 Drawing Sheets

U.S. PATENT DOCUMENTS

2004/0089928 A1* 5/2004 Nakajima et al. ............ 257/678
2004/0118579 A1* 6/2004 McCutcheon et al. ...... 174/16.3
2005/0056918 A1* 3/2005 Jeun et al. ................... 257/678

FOREIGN PATENT DOCUMENTS

| JP | 10-125826 | | 5/1998 |
|----|-----------|---|--------|
| JP | 10125826 | * | 5/1998 |
| JP | 11-243166 | | 9/1999 |
| JP | 11243166 | * | 9/1999 |
| JP | 2000-138343 | | 5/2000 |
| JP | 2000-294700 A | | 10/2000 |
| JP | 2000294700 | * | 10/2000 |
| JP | 2001-156253 | | 6/2001 |
| JP | 2003-124400 A | | 4/2003 |
| JP | 2003124400 | * | 4/2003 |
| KR | 2002-0066362 | | 8/2002 |

OTHER PUBLICATIONS

Korean Office Action dated Feb. 9, 2007.
Japanese Office Action dated Jan. 30, 2007.

* cited by examiner

SEMICONDUCTOR DEVICE AND METHOD FOR PRODUCING THE SAME

CROSS-REFERENCE TO RELATED APPLICATION

The disclosure of Japanese Patent Application No. 2003-339730 filed on Sep. 30, 2003 including specification, drawings and claims is incorporated herein by reference in its entirety

BACKGROUND OF THE INVENTION

1. Field of the Invention

The present invention relates to a semiconductor device, and more particularly, a power semiconductor device including a power chip.

2. Description of the Related Art

In a conventional power semiconductor device, a power chip, an IC chip and the like are each die-bonded on a frame and these chips are sealed with a resin. Since a power chip has large heat dissipation, a cooling fin is attached to the back surface of the semiconductor device for instance to thereby enhance a heat dissipation efficiency. The frames seating the power chips are coated with a resin and insulated from the cooling fin which is attached to the back surface (e.g., JP 2000-138343, A).

Meanwhile, such a semiconductor device has been proposed in which an insulator of alumina or the like shaped like a thin plate is attached to the back surface of the semiconductor device in an attempt to improve the heat dissipation property of the semiconductor device (e.g., JP 2001-156253, A)

SUMMARY OF THE INVENTION

While it is necessary for improvement in heat dissipation property that the resin covering the frames seating the power chips, namely, the resin between the back surfaces of the frames seating the power chips and the back surface of the semiconductor device is thin in the former semiconductor device, there is a problem that reduction in thickness of the resin disposed in these portions deteriorates an insulating property.

On the other hand, the latter semiconductor device has a problem that since the coefficients of thermal expansion of the insulator and the resin are largely different, the insulator gets peeled off from the resin owing to heat generated by the power chips. Further, since an interface is created between the insulator and the resin, it is necessary to ensure a distance for creeping insulation to provide creeping insulation at this interface and the size of the semiconductor device therefore increases.

Accordingly, an object of the present invention is to provide a semiconductor device which exhibits an enhanced heat dissipation property, provides excellent insulation and can be reduced in size.

The present invention is directed to a semiconductor device in which chips are resin-molded, including: frames having front and back surfaces and die pads; power chips mounted on the surfaces of the die pads; an insulation resin sheet having a first and a second surfaces which are opposed against each other, the resin sheet being disposed such that the back surfaces of the die pads contact the first surface of the resin sheet; and a mold resin applied on the first surface of the resin sheet so as to seal up the power chips, wherein the thermal conductivity of the resin sheet is larger than that of the mold resin.

The present invention is directed also to a method of producing a semiconductor device in which chips are resin-molded, including a frame preparation step of preparing frames having front and back surfaces and die pads; a step of preparing an insulation resin sheet having a first and a second surfaces; a step of mounting power chips on the surfaces of the die pads; a step of positioning the frames on the first surface of the resin sheet in such a manner that the back surfaces of the die pads contact the first surface of the resin sheet; and a resin mold step of injecting a sealing resin onto the first surface of the resin sheet so as to bury the power chips, wherein as the resin sheet, a resin whose thermal conductivity is larger than that of the sealing resin is used.

DETAILED DESCRIPTION OF THE PREFERRED EMBODIMENTS

Embodiment 1

Figure 1:
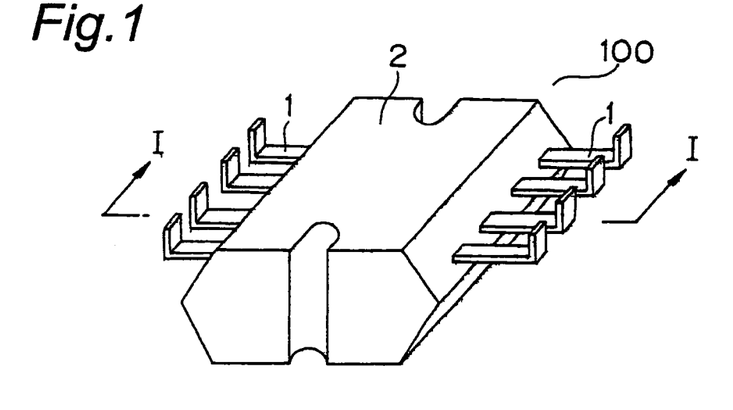
FIG. 1 is a perspective view of the semiconductor device according to the embodiment 1 of the present invention.
Figure 2:
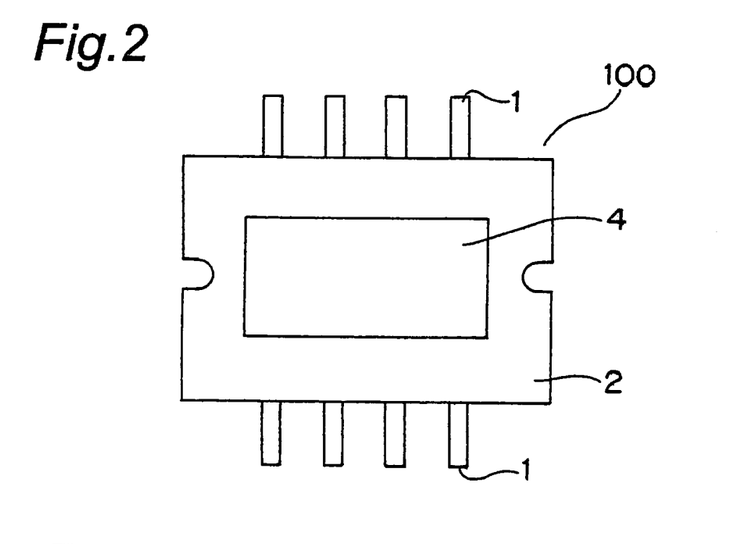
FIG. 2 is a back surface view of the semiconductor device according to the embodiment 1 of the present invention.
Figure 3:
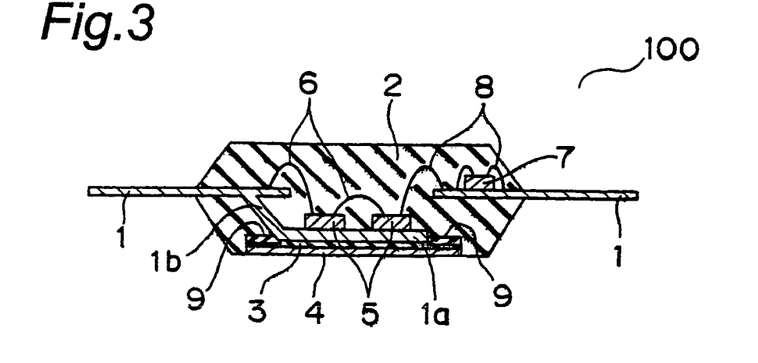
FIG. 3 is a cross sectional view of the semiconductor device according to the embodiment 1 of the present invention.
Figure 4:
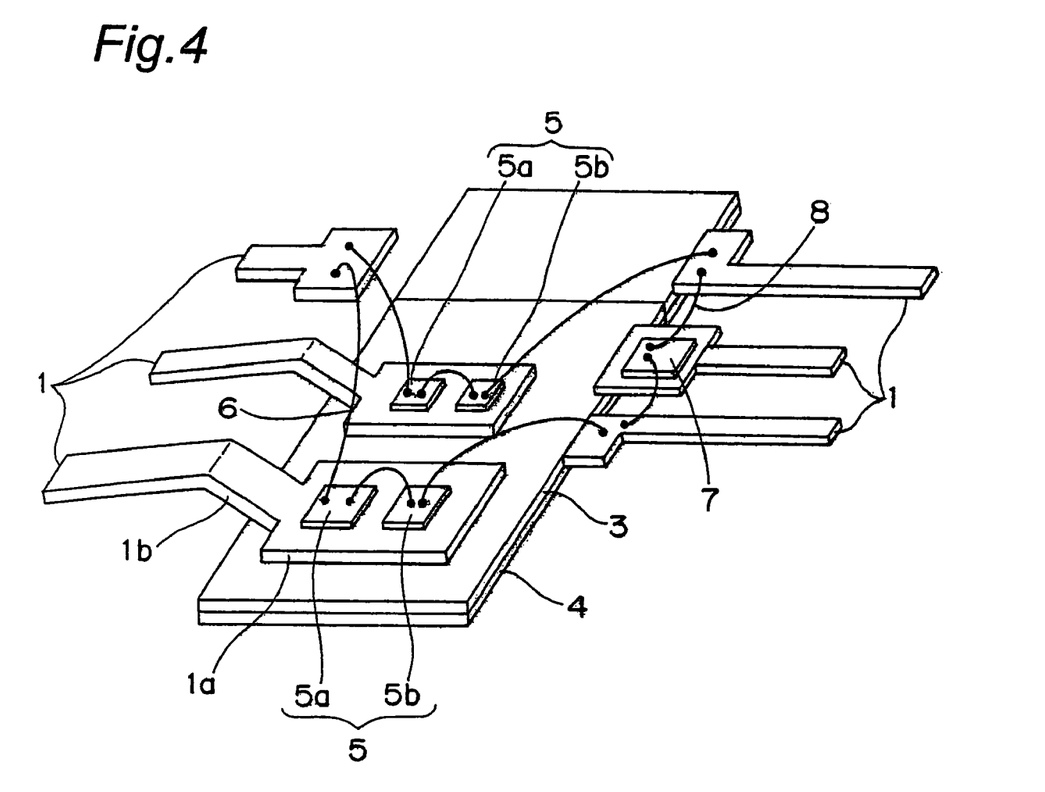
FIG. 4 is a perspective view which shows a portion inside the semiconductor device according to the embodiment of the present invention.

FIG. 1 is a perspective view of a semiconductor device according to this embodiment of the present invention generally denoted at 100. FIG. 2 is a back surface view of the semiconductor device 100 of FIG. 1 while FIG. 3 is a cross sectional view of the semiconductor device 100 of FIG. 1, both taken along the direction I-I. FIG. 4 is a perspective view which shows a portion inside the semiconductor device 100 of FIG. 1.

As shown in FIG. 1, the semiconductor device 100 has a resin-molded package structure and includes a mold resin 2 on the both sides of which a plurality of metal frames 1 are disposed. The mold resin 2 is preferably of an epoxy resin.

As shown in FIG. 2, to the back surface of the mold resin 2, an insulation resin sheet 3 is disposed whose back surface seats a metal foil 4 of copper for instance. The insulation resin sheet 3 is preferably of an epoxy resin containing fillers. The fillers are made of one or materials selected from $Sio_2$, $Al_2O_3$, AlN, $Si_3N_4$ and BN. The thermal conductivity of the insulation resin sheet 3 is larger than that of the mold resin 2.

As shown in FIG. 3, the semiconductor device 100 includes the plurality of frames 1. One frame mounts an IC chip 7 such as a logic chip, as shown in more detail in FIG. 4. Meanwhile, the other frame includes a die pad portion 1a and a step portion 1b, and the die pad portion 1a seats power chips 5 such as an IGBT and an FW Diode. The power chips 5, the IC chip 7 and the frames 1 are connected with each other by bonding wires 6 and 8 of gold, aluminum and the like for example, allowing the IC chip 7 control operations of the power chips 5.

In general, the power chips 5, the IC chip 7 and the like are fixed to the frames 1, using solder, silver paste and the like. The power chips 5 are connected by the bonding wires 8 of aluminum, while the IC chip 7 is connected by the bonding wires 6 of gold which have a smaller diameter.

More than one such power chips 5, IC chip 7 and the like may be disposed depending upon the functions of the semiconductor device 100.

As described above, the mold resin 2 includes the insulation resin sheet 3 to which the metal foil 4 is attached, and the metal foil 4 is exposed in the back surface of the mold resin 2. The metal foil 4 protects the resin sheet 3 from damage, and the resin sheet 3 can therefore provide excellent insulation. The damage in this context can be such damage which develops when the semiconductor device 100 is screwed to an external heat sink (not shown) with foreign matters present between the semiconductor device 100 and the external heat sink. In the event that damage is unlikely, a structure which does not use the metal foil 4 may be used. In that case, the insulation resin sheet 3 is exposed in the back surface of the mold resin 2.

The frames 1 are mounted on the insulation resin sheet 3 such that the back surfaces of the die pads 1a are in direct contact with the insulation resin sheet 3. The surface area size of the insulation resin sheet 3 is larger than that of the die pads 1a. Further, the power chips 5, the IC chip 7 and the like are sealed with the mold resin 2.

In an area where the insulation resin sheet 3 contacts the mold resin 2, there is a mixture layer 9 in which the both resins are mixed. Since the insulation resin sheet 3 and the mold resin 2 are thus connected with each other through the mixture layer 9, the thermal conductivity between the insulation resin sheet 3 and the mold resin 2 is higher and the heat dissipation property is better than where no mixture layer 9 is provided. A method of forming the mixture layer 9 will be described later.

The thermal conductivity of the insulation resin sheet 3 is preferably larger than that of the mold resin 2, and more preferably is twice as large as that of the mold resin 2 or larger. This realizes the semiconductor device 100 which exhibits an excellent heat dissipation property.

The method of producing the semiconductor device 100 will now be described with reference to FIGS. 5A-5G. This producing method includes the following steps 1 through 8. FIGS. 5A-5G are cross sectional views taken along the same direction as the direction I-I shown in FIG. 1.

Figure 5A:
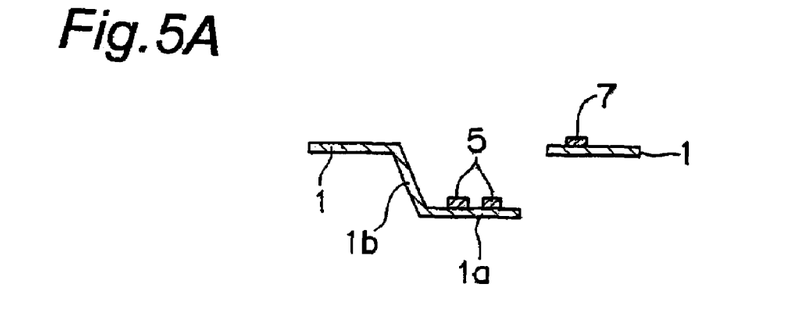
FIGS. 5A-5G are cross sectional views of the producing steps the semiconductor device according to the embodiment 1 of the present invention.

Step 1: As shown in FIG. 5A, the frames 1 of copper for instance are prepared. This is followed by fixing of the IC chip 7 on one frame 1 and the power chips 5 on the die pads 1a of the other frames 1, each using solder, silver paste or the like.

Figure 5B:
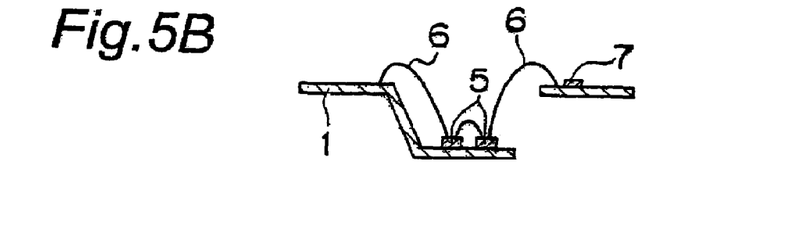

Step 2: As shown in FIG. 5B, using the bonding wires 6 of aluminum, the power chips 5 are connected with each other, the power chips 5 and the frames 1 are connected with each other, and the frames 1 are connected with each other (aluminum wire bonding step). As the bonding wires 6, alloy mainly containing aluminum, or other metal may be used.

Figure 5C:
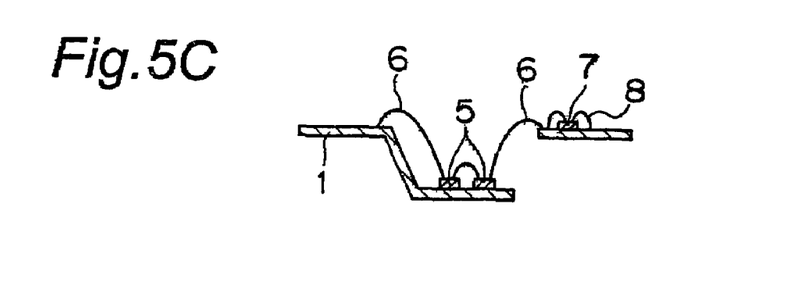

Step 3: As shown in FIG. 5C, using the bonding wires 8 of gold, the IC chip 7 and the frames 1 are connected with each other (gold wire bonding step). As the bonding wires 8, alloy mainly containing gold, or other metal may be used.

Figure 5D:
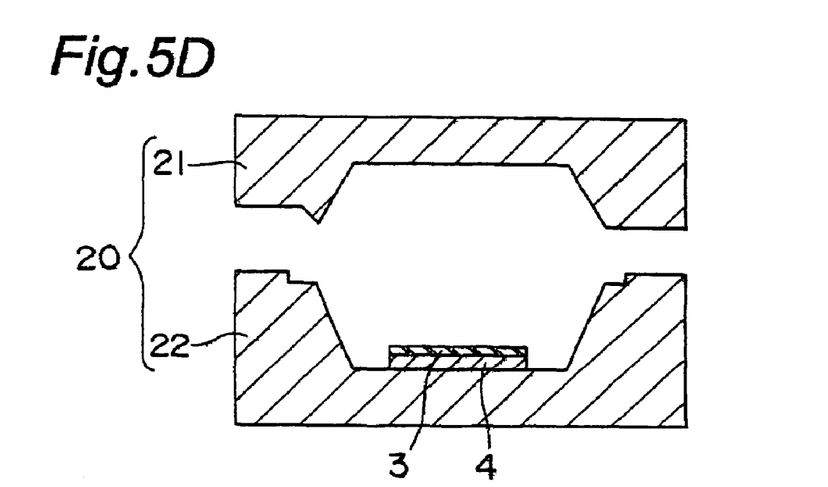

Step 4: As shown in FIG. 5D, a metal mold 20 for resin-sealing is prepared. The metal mold 20 can be separated into an upper metal mold 21 and a lower metal mold 22. Following this, the insulation resin sheet 3 whose back surface seats the metal foil 4 is prepared and located at a predetermined position inside the metal mold 20. The resin sheet 3 is positioned so that the back surface of the metal foil 4 contacts an inner bottom surface of the lower metal mold 22. As the resin sheet 3 at this stage, a half hardened resin is used. The resin sheet 3 is preferably made of an epoxy resin containing fillers as described above.

A half hardened resin is a thermosetting resin as it has imperfectly hardened which remains solid at an ordinary temperature but starts hardening completely after once melting at a high temperature.

Figure 5E:
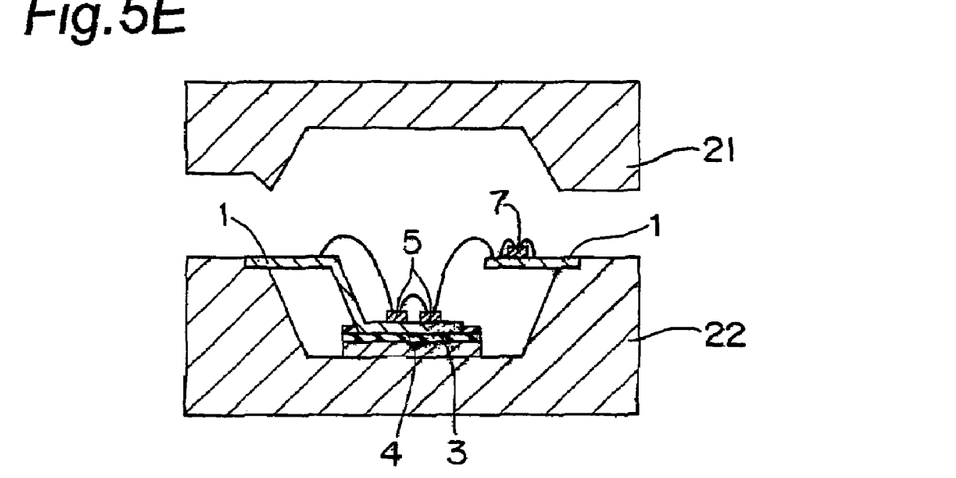

Step 5: As shown in FIG. 5E, the frames 1 seating the power chips 5 and the like are located at predetermined positions inside the metal mold 20. The frames 1 are positioned so that the back surfaces of the die pads 1a of the other frames 1 contact the top surface of the resin sheet 3.

Figure 5F:
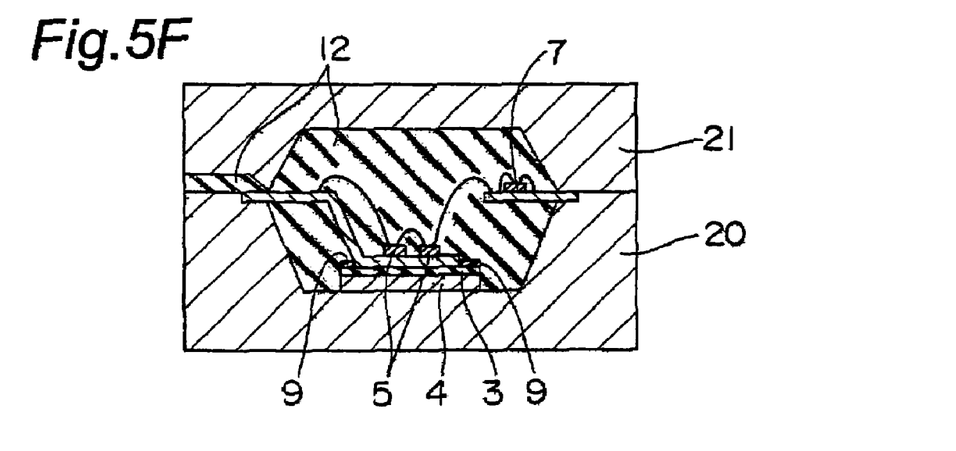

Step 6: As shown in FIG. 5F, the upper metal mold 21 is attached and fixed to the lower metal mold 22. By a transfer mold method, the sealing resin 12 formed by an epoxy resin for example is thereafter injected in the resin-sealing metal mold 20. In FIG. 5F, the sealing resin 12 is injected from the left-hand side.

At this step, the half hardened resin sheet 3 disposed inside the metal mold 20 first receives heat from the metal mold 20 which is at a high temperature, and melts. The sealing resin 12 injected under pressure pressurizes and fixes the resin sheet 3 and the die pads 1a.

Figure 5G:
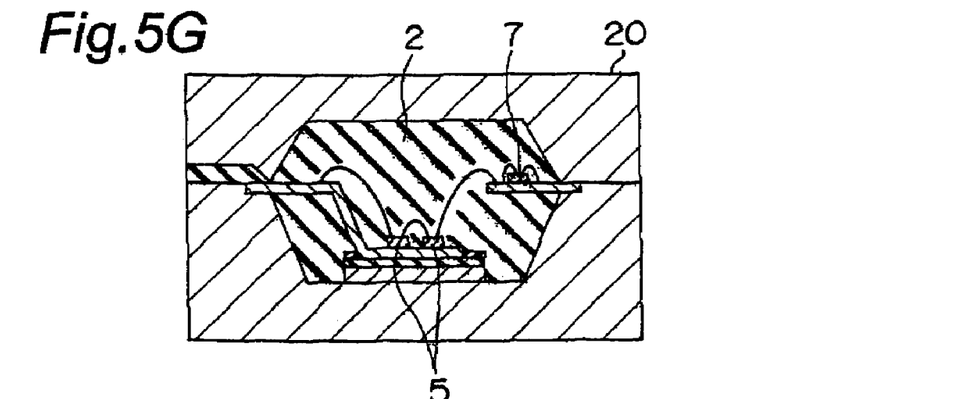

Step 7: As shown in FIG. 5G, the mold resin 2 and the resin sheet 3 are heated and hardened. Since the resin sheet 3 and the sealing resin 12 contact each other as they have melted at this step, they mix with each other, and where they thus contact each other, the mixture layer 9 is formed.

The steps 4 through 7 are so-called transfer mold steps. Although the resin sheet 3 is pressurized while melting at these steps, since the inside of the metal mold 20 is entirely pressurized by the sealing resin 12, the thickness of the resin sheet 3 rarely changes. Meanwhile, the respective portions inside the metal mold 20 do not get filled with the sealing resin 12 at the same time, and there arise time differences, although small, between the time needed for the respective portions to get evenly pressurized. Noting this, the resin sheet 3 preferably has a low flow property when melting.

Step 8: After releasing from the metal mold 20, post cure for completely hardening the mold resin, cutting of excessive frame portions such as tie bars, and the like are executed. The frames (external terminals) 1 are further molded, thereby completing the semiconductor device 100 as that shown in FIG. 1.

It is preferable that the resin sheet 3 is included mainly of an epoxy resin, and for the purpose of enhancing mainly the thermal conductivity, contains insulation fillers of $SiO_2$ or the like as described above. Since the fillers attain an effect of reducing the coefficient of linear expansion of the resin sheet 3, a difference in terms of coefficient of linear expansion between the die pads 1a and the metal foil 4 becomes small. This makes peeling caused by a temperature change unlikely and realizes excellent reliability.

When the sealing resin 12 is also of a material mainly containing an epoxy resin like the resin sheet 3, the mixture layer 9 is formed stably. In this case, since there is no clear interface between the sealing resin 12 and the resin sheet 3 and it therefore is not necessary to consider creeping insulation between the sealing resin 12 and the resin sheet 3, it is possible to reduce the size of the semiconductor device.

In addition, it was clarified through an experiment as described later that when the fillers of the resin sheet 3 were shaped like scales, it was possible to more stably ensure insulation than where the fillers were shaped like particles.

In this experiment, the semiconductor devices 100 were fabricated using a resin sheet containing scale-like fillers and a resin sheet containing the same amount of particle fillers, and tested regarding insulation. Table 1 shows the result of the insulation test.

TABLE 1

| Scale Shaped | r/N = 0/10 |
|---|---|
| Particle Shaped | r/N = 3/10 |

In the table, the symbol r denotes the number of samples which failed and the symbol N denotes the number of samples which were tested.

Further, since the scale-like fillers have a larger specific surface area than the particle fillers, the area size of contact with the sheet resin is larger and the flow property in the molten state decreases.

Figure 6:
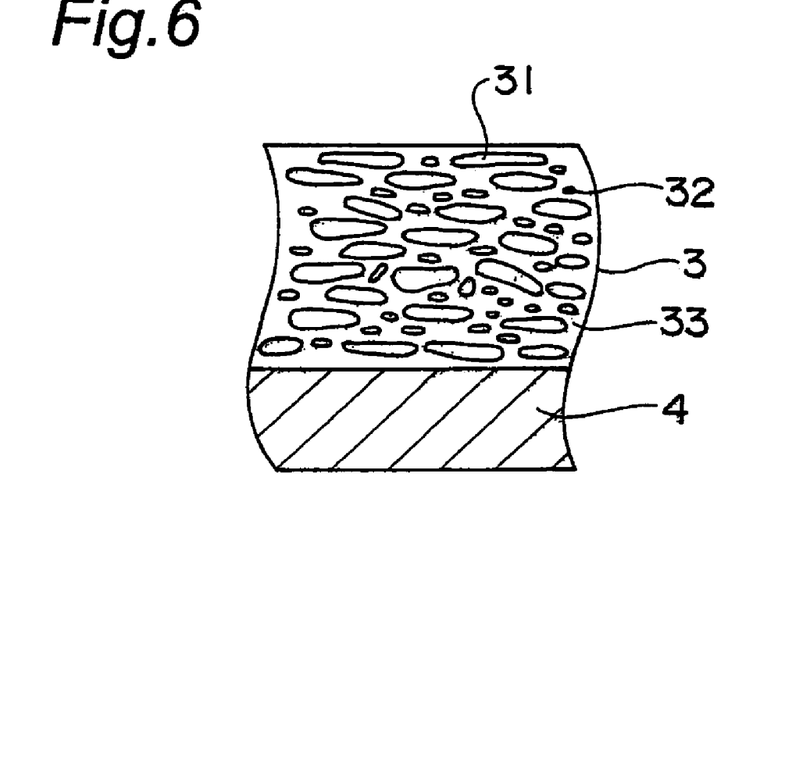
FIG. 6 is an expanded view of the resin sheet.

As for the filler size, fillers of a large size (a large maximum diameter) and fillers of a small size (a small maximum diameter) may be mixed with each other. FIG. 6 is an expanded view of a cross section of the resin sheet 3 containing fillers of two types of sizes. The resin sheet 3 has a structure that fillers 31 of a large size and fillers 32 of a small size are contained in a resin layer 33 formed by an epoxy resin or the like.

As shown in FIG. 6, since the fillers 32 of the small size can be injected in the gaps between the fillers 31 of the large size, the thermal conductivity of the resin sheet 3 further improves.

As described above, the semiconductor device 100 according to this embodiment uses the insulation resin sheet 3 in which the thickness of the insulation layer can be determined in advance. Hence, adjustment of the film thickness of the resin sheet 3 achieves such control which causes no conflict between the insulating property and the heat dissipation property.

Further, since the resin sheet 3 is disposed only where it is needed, an unnecessary cost is reduced.

In addition, since the mixture layer 9 is formed at the interface between the resin sheet 3 and the mold resin 2 in the semiconductor device 100, it is not necessary to consider creeping insulation and it is therefore possible to reduce the size of the semiconductor device.

Although the IC chip 7 and the like are connected by the bonding wires in the embodiment 1, other members such as thin metal plates may be used instead for instance. Further, while the foregoing has described the example that the IC chip 7 and the power chips 5 are connected temporarily via the relay frames, these may be connected directly.

Embodiment 2

Figure 7:
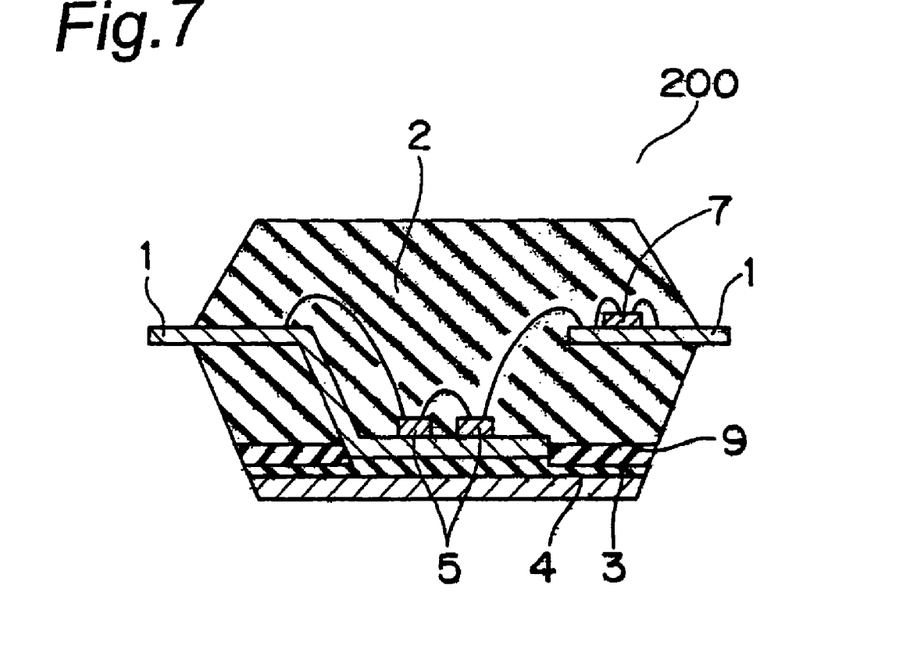
FIG. 7 is a cross sectional view of the semiconductor device according to the embodiment 2 of the present invention.

FIG. 7 is a cross sectional view of a semiconductor device according to this embodiment of the present invention generally denoted at 200. FIG. 7 is a cross sectional view taken along the same direction as the direction I-I shown in FIG. 1. In FIG. 7, the same reference symbols as those in FIGS. 1-3 denote the same or corresponding portions.

In the semiconductor device 200 according to the embodiment 2, the resin sheet 3 seating the metal foil 4 has such a size which covers the entire back surface of the mold resin 2. The semiconductor device is otherwise the same in structure as the semiconductor device 100 described above.

The semiconductor device 200 exhibits an enhanced heat dissipation property, and does not require positioning of the resin sheet 3 at the producing steps (the step 4 described above). In other words, since the resin sheet 3 has the same size as that of an inner bottom surface of the resin-sealing metal mold 20, it is not necessary to precisely control the location for positioning. This simplifies the producing steps.

Embodiment 3

Figure 8:
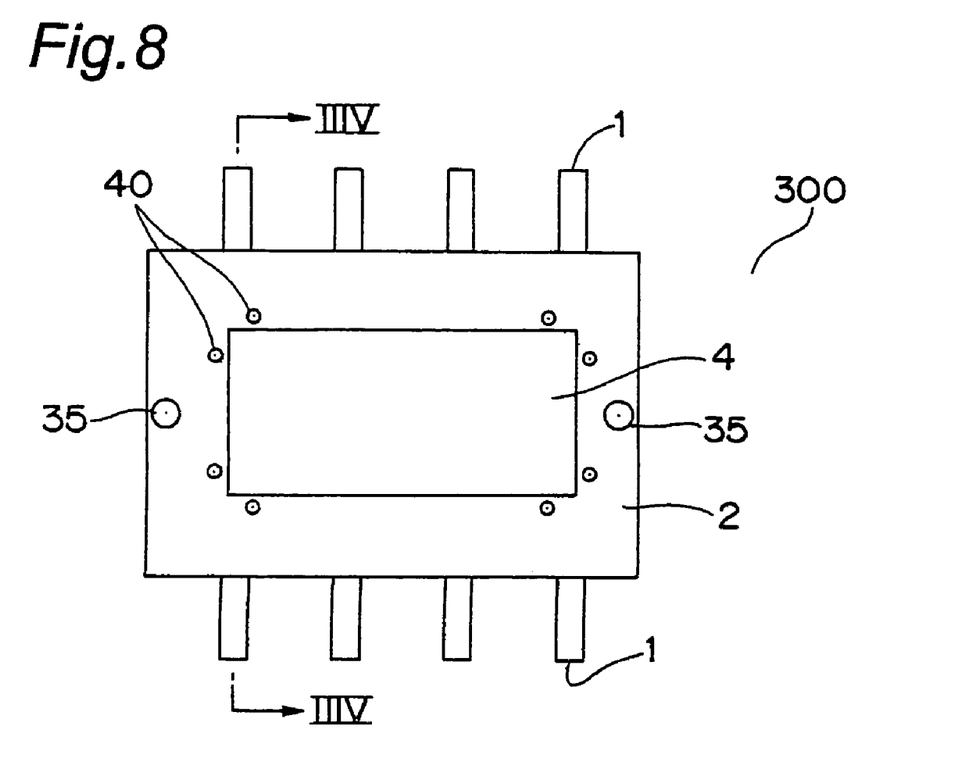
FIG. 8 is a back surface view of the semiconductor device according to the embodiment 3 of the present invention.
Figure 9:
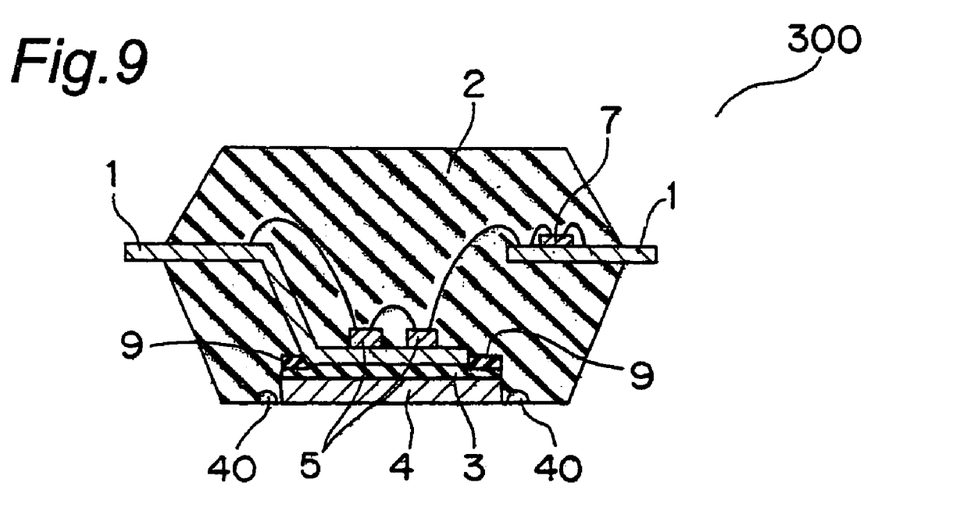
FIG. 9 is a cross sectional view of the semiconductor device according to the embodiment 3 of the present invention.

FIG. 8 is a back surface view of a semiconductor device according to this embodiment of the present invention generally denoted at 300. FIG. 9 is a cross sectional view taken along the direction IIIV-IIIV of FIG. 8. In FIGS. 8 and 9, the same reference symbols as those in FIGS. 1-3 denote the same or corresponding portions.

The semiconductor device 300 includes a plurality of concave portions 40 around the sheet resin 3. Further, screw holes 35 are formed which are for attaching a cooling fin (not shown).

The concave portions 40 are created in the resin sheet 3 as a plurality of projections (not shown) are formed in the inner bottom surface of the metal mold 20 at the step 4 described above (FIG. 5D) for the purpose of making the positioning easy. In the inner bottom surface of the metal mold 20, the projections are disposed along the area where the resin sheet 3 is disposed.

The projections disposed in the inner bottom surface of the metal mold 20 thus makes the positioning of the resin sheet 3 easy and simplifies the producing steps.

Although the concave portions 40 are approximately cylindrical in FIGS. 8 and 9, other shape may be used as long as the function above is realized. The number of the concave portions 40 may be any number as long as this function is realized.

Further, it is desirable that the depth of the concave portions 40 is shallower than the thickness of the metal foil 4. This is because even when the concave portions 40 overlap the metal foil 4 by mistake, the tips of the concave portions 40 will not reach the resin sheet 3 and the resin sheet 3 will not be damaged.

Since the resin sheet is used in the semiconductor device according to the present invention, the semiconductor device exhibits an enhanced heat dissipation property and provides excellent insulation. Further, the size of the semiconductor device can be reduced.

What is claimed is:

1. A semiconductor device in which chips are resin-molded, comprising:
    frames having die pads including front and back surfaces;
    power chips mounted on the front surfaces of the die pads;
    an insulation resin sheet having first and second surfaces on opposite sides of said insulation resin sheet, the insulation resin sheet being disposed such that the back surfaces of the die pads contact the first surface of the insulation resin sheet;
    a mold resin applied on the first surface of the insulation resin sheet so as to seal up the power chips;
    a mixture layer formed on the first surface of the insulation resin sheet where the insulation resin sheet contacts the mold resin and formed of a mixture of said insulation resin sheet and said mold resin; and
    a metal foil disposed on the second surface of the insulation resin sheet, wherein the thermal conductivity of the insulation resin sheet is at least twice as large as that of the mold resin, and wherein the mixture layer results from contacting the insulation resin sheet in a molten state with the mold resin in a molten state.

2. The semiconductor device according to claim 1, wherein the insulation resin sheet and the mold resin are both formed by an epoxy resin.

3. The semiconductor device according to claim 1, wherein the area size of the insulation resin sheet is larger than that of the die pads which are on the insulation resin sheet.

4. The semiconductor device according to claim 1, wherein the insulation resin sheet and the die pads are in direct contact.

5. The semiconductor device according to claim 1, wherein the frames include the die pads, lead portions which are approximately parallel to the die pads, and step portions which connect the die pads with the lead portions in such a manner that the die pads and the lead portions form steps.

6. The semiconductor device according to claim 1, wherein the insulation resin sheet is formed by a resin which contains at least one filler selected from $SiO_2$, $Al_2O_3$, AlN, $Si_4$ and BN.

7. The semiconductor device according to claim 6, wherein the filler has a shape like scales.

8. The semiconductor device according to claim 7, wherein the filler is comprised of two or more types of fillers having different maximum particle diameters.

* * * * *